(12) United States Patent
Bleckmann et al.

(10) Patent No.: US 11,180,030 B2
(45) Date of Patent: Nov. 23, 2021

(54) SWITCHING DEVICE FOR SWITCHING DRIVE ELEMENTS IN A MOTOR VEHICLE

(71) Applicant: Leopold Kostal GmbH & Co. KG, Luedenscheid (DE)

(72) Inventors: Michael Bleckmann, Schwerte-Ergste (DE); Uwe Borgmann, Recklinghausen (DE)

(73) Assignee: KOSTAL Automobil Elektrik GmbH & Co. KG, Luedenscheid (DE)

( * ) Notice: Subject to any disclaimer, the term of this patent is extended or adjusted under 35 U.S.C. 154(b) by 162 days.

(21) Appl. No.: 16/689,436

(22) Filed: Nov. 20, 2019

(65) Prior Publication Data

US 2020/0086742 A1    Mar. 19, 2020

Related U.S. Application Data

(63) Continuation of application No. PCT/EP2018/066204, filed on Jun. 19, 2018.

(30) Foreign Application Priority Data

Jun. 21, 2017   (DE) .................... 10 2017 005 846.6

(51) Int. Cl.
   *B60K 37/06*   (2006.01)
   *H03K 17/96*   (2006.01)
   (Continued)

(52) U.S. Cl.
   CPC ............. *B60K 37/06* (2013.01); *B60J 1/16* (2013.01); *B60J 7/02* (2013.01); *H03K 17/9622* (2013.01);
   (Continued)

(58) Field of Classification Search
   CPC . H03K 17/9622; H03K 17/9643; B60K 37/06
   See application file for complete search history.

(56) References Cited

U.S. PATENT DOCUMENTS 4,442,506 A * 4/1984 Endfield ............... G06F 3/0235
                                                             341/22
5,017,030 A * 5/1991 Crews ....................... B41J 5/10
                                                             400/476
(Continued)

FOREIGN PATENT DOCUMENTS

DE    102009031649 A1    1/2011
DE    112010004756 T5    3/2013
(Continued)

OTHER PUBLICATIONS

The International Bureau of WIPO, International Preliminary Report on Patentability for International Application No. PCT/EP2018/066204, dated Dec. 24, 2019.
(Continued)

*Primary Examiner* — Albert K Wong
(74) *Attorney, Agent, or Firm* — Brooks Kushman P.C.

(57) ABSTRACT

A switching device for actuating drive elements includes first switching elements situated on a housing surface to be actuatable by fingers of a person and a second switching element situated on a housing surface to be actuatable by a palm, a palm heel, or a thumb of the person. The first and second switching elements are formed by touch surface sensors without switching contacts. In one variation, actuation of one of the first switching elements causes actuation of a corresponding one of the drive elements only when the second switching element is actuated during the actuation of the one of the first switching elements. In another variation, simultaneous actuation of one of the first switching elements and the second switching element causes a drive element corresponding to the one of the first switching elements to be actuated according to a function corresponding to the second switching element.

12 Claims, 2 Drawing Sheets

(51) Int. Cl.
*B60J 1/16* (2006.01)
*B60J 7/02* (2006.01)

(52) U.S. Cl.
CPC .... *H03K 17/9643* (2013.01); *B60K 2370/139* (2019.05); *B60K 2370/1446* (2019.05); *B60K 2370/691* (2019.05); *H03K 2217/96062* (2013.01)

(56) References Cited

U.S. PATENT DOCUMENTS

| | | | | |
|---|---|---|---|---|
| 5,432,510 | A * | 7/1995 | Matthews | H03K 17/967 341/20 |
| 6,232,956 | B1 * | 5/2001 | Mailman | G06F 3/018 341/21 |
| 6,323,846 | B1 * | 11/2001 | Westerman | G06K 9/6272 345/173 |
| 6,429,854 | B1 * | 8/2002 | McKown | G06F 3/0219 200/5 R |
| 6,542,091 | B1 * | 4/2003 | Rasanen | G06F 3/0219 341/22 |
| 7,663,607 | B2 * | 2/2010 | Hotelling | G06F 3/0445 345/173 |
| 8,055,412 | B2 * | 11/2011 | Passaro | B60K 35/00 701/49 |
| 10,452,174 | B2 * | 10/2019 | Westerman | G06F 3/041 |
| 2006/0144680 | A1 | 7/2006 | Pelletier et al. | |
| 2010/0109915 | A1 * | 5/2010 | Scarboro | H03M 11/18 341/20 |
| 2011/0141052 | A1 | 6/2011 | Bernstein et al. | |
| 2013/0187889 | A1 | 7/2013 | Pandher et al. | |
| 2014/0069015 | A1 | 3/2014 | Salter et al. | |
| 2014/0266812 | A1 * | 9/2014 | Rajkowski | G06F 3/0234 341/22 |
| 2015/0019083 | A1 | 1/2015 | Kalliomaki et al. | |
| 2017/0083107 | A1 * | 3/2017 | Shim | G06F 3/047 |

FOREIGN PATENT DOCUMENTS

| | | |
|---|---|---|
| DE | 102014009960 A1 | 1/2015 |
| DE | 102014009355 A1 | 12/2015 |
| DE | 102017113661 A1 | 12/2018 |
| EP | 1978535 A2 | 10/2008 |

OTHER PUBLICATIONS

European Patent Office, International Search Report for International Application No. PCT/EP2018/066204, dated Sep. 5, 2018.
German Patent and Trademark Office, German Search Report for German patent application No. DE 10 2017 005 846.6, dated Sep. 24, 2019.

* cited by examiner

SWITCHING DEVICE FOR SWITCHING DRIVE ELEMENTS IN A MOTOR VEHICLE

CROSS-REFERENCE TO RELATED APPLICATIONS

This application is a continuation of International Application No. PCT/EP2018/066204, published in German, with an International filing date of Jun. 19, 2018, which claims priority to DE 10 2017 005 846.6, filed Jun. 21, 2017; the disclosures of which are hereby incorporated in their entirety by reference herein.

TECHNICAL FIELD

The present invention relates to a switching device for switching drive elements in a motor vehicle, the switching device including multiple first switching elements situated on a housing surface and via which drive elements to be actuated can be selected and at least one second switching element situated on a housing surface and that influences the functioning of the drive element selected by a first switching element, wherein the first switching elements are actuatable by fingers of a person and the at least one second switching element is actuatable with a palm, a palm heel, or a thumb of the person.

BACKGROUND

This type of switching device is known from German Patent specification DE 192 07 952 C2. Drive elements such as left and right window lifts in a motor vehicle are selected and actuated by two first switching elements that can be operated by an operator's fingers. A second switching element to be optionally actuated additionally allows changing the drive elements to be actuated so that, for example, instead of the front window lifts, the rear window lifts are then actuatable by the first switching elements. In a first proposed embodiment, the second switching element is situated on the same surface as the first switching elements and is actuatable with the operator's palm or palm heel. In a second proposed embodiment, the second switching element is situated on a lateral housing surface and is actuated with the operator's thumb. The first switching elements and the second switching element are described as being mechanical switches. For mechanical switching elements, unintended actuations due to accidental contact are generally not a particular problem on account of relatively high trigger force thresholds.

The statement that certain switching elements are "actuatable with the finger, palm heel, or thumb" of an operator (i.e., a person) is not intended to mean that functions of these switching elements can be triggered only by these body parts of the operator; rather, during routine use of the switching device, the particular named body parts are provided and may also be advantageously used for actuating the switching elements.

In current motor vehicles, the configuration of the interior is continually changing with respect to earlier designs. Individual function elements or form elements are combined, joints and changes in height are reduced, and lighting units and functions are not always visible. Switching via contact sensors or force sensors offers the option of meeting the requirements of modern design and, in many areas, this is currently already being implemented.

The US FMVSS Standard 118 makes implementation more difficult for control elements for windows and sliding roofs. According to the standard, with these control elements it must not be possible to accidentally close the window or roof.

For switching devices that are based on a touch sensor system, undesirably triggered switching functions due to unintentional contact represent a critical problem.

SUMMARY

An object in accordance with embodiments of the present invention is a switching device for windows or sliding roofs in a motor vehicle, which has a closed, gap-free surface, allows simple and convenient operation, and reliably prevents unintentional safety-critical actuation of a drive element.

This object is achieved according to embodiments of the present invention in that the first switching elements and the at least one second switching element are formed by touch surface sensors without switching contacts, and the switching-on of a drive element via the actuation of a first switching element requires the simultaneous actuation of a second switching element.

Basically, it is thus proposed that for activating a function, switching elements from two sensor areas must be simultaneously actuated, at least temporarily. Due to the actuation of a second switching element, for example by placing the palm heel on a defined part of the armrest in the door of the motor vehicle or by placing the thumb on a lateral surface of the armrest, enabling of a window lift function that has been selected via the first switching elements may take place.

One particularly advantageous option is to divide window lift functions over two sensor areas. Thus, for example, the selection of the window(s) to be actuated may be made on an upper housing surface, and the selection of the desired direction of movement may be made on a lateral housing surface. The number of first switching elements needed on the upper housing surface may thus be reduced by half.

A switching device for switching drive elements in a motor vehicle in accordance with embodiments of the present invention includes multiple first switching elements and at least one second switching element. The first switching elements are situated on a housing surface. Drive elements to be actuated can be selected via the first switching elements. The at least one second switching element is situated on a housing surface. The functioning of a drive element that is selected by a first switching element is influenced via a second switching element. The first switching elements are actuatable by fingers of a person. The at least one second switching element is actuatable with a palm, a palm heel, or a thumb of the person. The first switching elements and the at least one second switching element are formed by touch surface sensors without switching contacts. The switching-on of a drive element via the actuation of a first switching element requires the simultaneous actuation of a second switching element.

In carrying out the above-identified object and/or one or more other objects, a switching device for actuating drive elements is provided. This switching device includes first switching elements situated on a housing surface to be actuatable by fingers of a person and a second switching element situated on a housing surface to be actuatable by a palm, a palm heel, or a thumb of the person. Each switching element is formed by a touch surface sensor without any switching contact. Actuation of one of the first switching elements causes actuation of a corresponding one of the drive elements only when the second switching element is actuated during the actuation of the one of the first switching elements.

The first switching elements and the second switching element may be situated in parallel to one another on the same housing surface. The first switching elements and the second switching element may be situated on different housing surfaces that are approximately perpendicular to one another.

The switching device may further include a mechanical actuator for generating switch haptics.

The first switching elements and/or the second switching element may be configured to detect actuating forces.

Two of the drive elements may be first and second windows of a vehicle. One of the drive elements may be a sliding roof of a vehicle.

Further, in carrying out the above-identified object and/or one or more other objects, another switching device for actuating drive elements is provided. This switching device includes first switching elements situated on a housing surface to be actuatable by fingers of a person and second switching elements situated on a housing surface to be actuatable by a palm, a palm heel, or a thumb of the person. Each switching element is formed by a touch surface sensor without any switching contact. Simultaneous actuation of one of the first switching elements and one of the second switching elements causes a drive element corresponding to the one of the first switching elements to be actuated according to a function corresponding to the one of the second switching elements.

Simultaneous actuation of the one of the first switching elements and another one of the second switching elements causes the drive element corresponding to the one of the first switching elements to be actuated according to another function corresponding to the another one of the second switching elements.

Simultaneous actuation of another one of the first switching elements and the one of the second switching elements causes another drive element corresponding to the another one of the first switching elements to be actuated according to the function corresponding to the one of the second switching elements.

In an embodiment, the drive element corresponding to the one of the first switching elements is a window of a vehicle and the function corresponding to the one of the second switching elements is either (i) a close window control function, whereby the window is actuated to close during simultaneous actuation of the one of the first switching elements and the one of the second switching elements, or (ii) an open window control function, whereby the window is actuated to open during simultaneous actuation of the one of the first switching elements and the one of the second switching elements.

In an embodiment, the drive element corresponding to the one of the first switching elements is a window of a motor vehicle and the function corresponding to the one of the second switching elements is either (i) a first position control function, whereby the window is actuated to move to a first position during simultaneous actuation of the one of the first switching elements and the one of the second switching elements, or (ii) a second position control function, whereby the window is actuated to move to a second position during simultaneous actuation of the one of the first switching elements and the one of the second switching elements.

In an embodiment, the second switching elements include at least three adjacently situated second switching elements and actuating direction and/or actuating speed are/is detected when multiple adjacently situated second switching elements are actuated in succession.

BRIEF DESCRIPTION OF THE DRAWINGS

The present invention is explained in greater detail below and illustrated with reference to the drawings, which show the following.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Referring now to FIGS. 1, 2, 3, and 4, respective exemplary embodiments of a switching device in accordance with the present invention are illustrated. These embodiments are used by way of example for controlling windows in a motor vehicle that are movable by a motor.

The switching device is for controlling (e.g., actuating; switching on and switching off; etc.) one or more drive elements. For example, the drive elements may be the windows or a sliding roof of a motor vehicle. In this case, the switching device may be used for closing and opening the windows and sliding roof.

Figure 1:
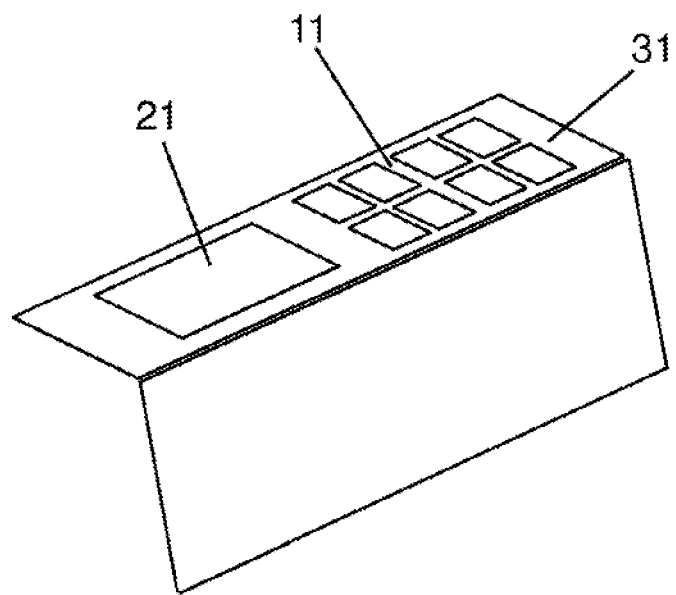
FIGS. 1, 2, 3, and 4 each illustrate a respective exemplary embodiment of the switching device in accordance with the present invention.
Figure 2:
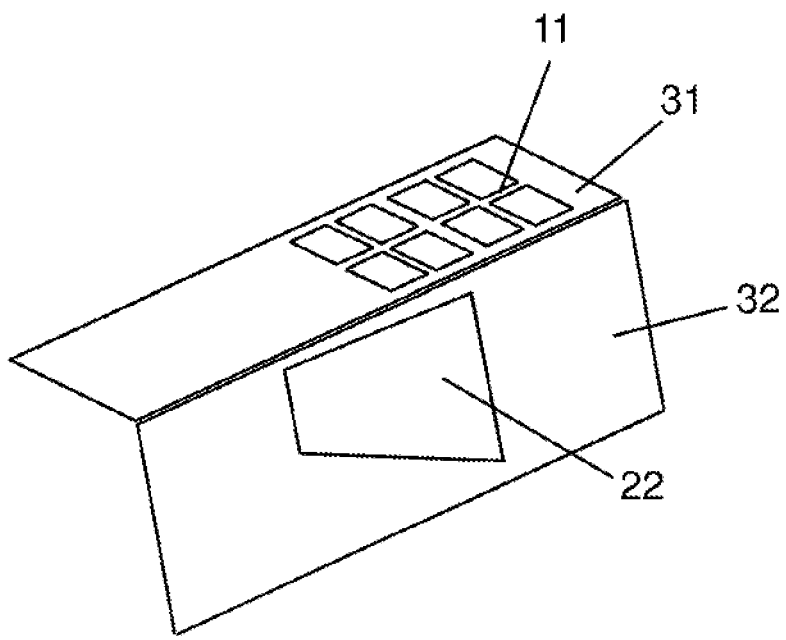
Figure 3:
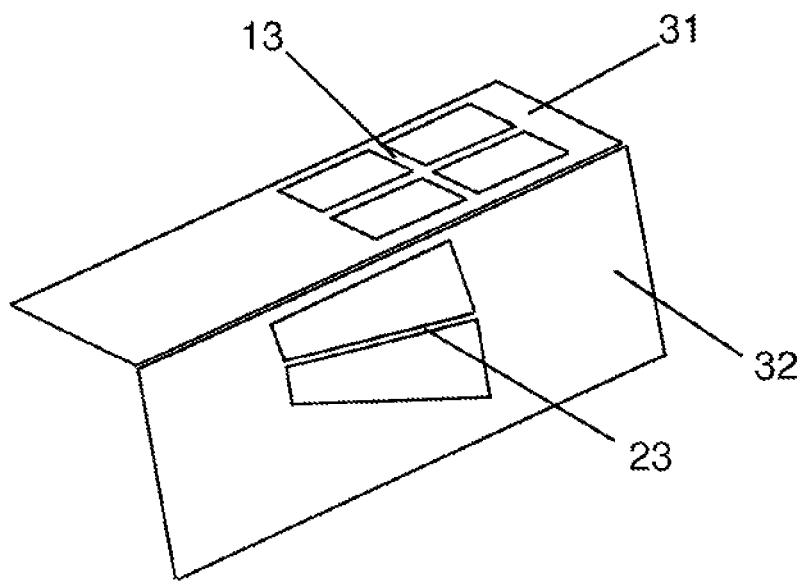
Figure 4:
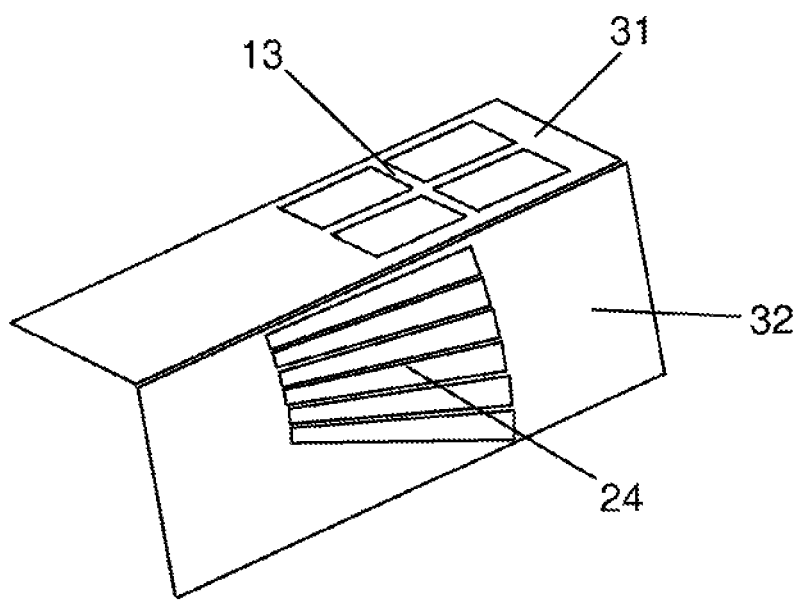

The switching device includes multiple first switching elements situated on a housing surface. For instance, the switching device as shown in FIGS. 1 and 2 includes first switching elements 11 situated on housing surface 31; and the switching device as shown in FIGS. 3 and 4 includes first switching elements 13 situated on housing surface 31.

The switching device further includes at least one second switching element situated on a housing surface. For instance, the switching device as shown in FIG. 1 includes a second switching element 21 situated on housing surface 31; the switching device as shown in FIG. 2 includes a second switching element 22 situated on a housing surface 32; the switching device as shown in FIG. 3 includes two second switching elements 23 situated on housing surface 32; and the switching device as shown in FIG. 4 includes multiple switching elements 24 situated on housing surface 32.

First and second switching elements 11, 13, 21, 22, 23, 24 designed as touch surface sensors without switching contacts are depicted in the illustrations. The touch surface sensors may function according to various sensor principles. They are preferably designed as capacitive or piezoelectric sensors.

The touch surface sensors are mounted on surfaces situated on the inside of a driver-side motor vehicle door. The surfaces are referred to below as housing surfaces 31, 32 for the sake of simplicity. In all of the embodiments described here, operation of the touch surface sensors with the left hand is provided by way of example.

Since in particular the arrangement of the touch surface sensors is essential for explaining the present invention, illustrations of further electrical and mechanical components are omitted in the drawings.

A common characteristic of touch surface sensors without switching contacts is that they are actuatable without much effort. However, even inadvertent contact may easily trigger switching functions, which may result in safety problems in the switching of drive elements. Therefore, it is provided that in order to trigger a switching function, a touch surface sensor from a group of first switching elements 11, 13 and a touch surface sensor that forms a second switching element 21, 22, 23, 24 must be actuated at the same time. The aim is to allow the actuation to take place in a simple, convenient, and intuitively understandable manner.

FIG. 1 shows a switching device in which the touch surface sensors are arranged on a shared housing surface 31 in groups of first and second switching elements 11, 21. First switching elements 11 form a matrix-like arrangement of eight rectangular touch surface sensors, with which the window lift functions presented in the following table are associated:

| Front driver's side up | Front passenger side Up |
|---|---|
| Front driver's side down | Front passenger side down |
| Rear driver's side up | Rear passenger side Up |
| Rear driver's side down | Rear passenger side down |

The functions are arranged in an intuitively obvious manner. Thus, for example, functions on the driver's side are situated on the left side, functions of the front windows are situated above those of the rear windows, and functions for controlling the upward movements of the windows are situated above those for controlling downward movements.

A single touch surface sensor 21 is provided as second switching element 21; it is situated next to first switching elements 11 and occupies an area similar to that of all first switching elements 11 combined. This second touch surface sensor 21 is provided to be actuated by resting the palm heel of the left hand on it, while first switching elements 11 are actuated by the fingertips.

Only when the actuation of a first switching element 11 and of the second switching element 21 take place at the same time does the switching device register this as a valid actuation and triggers the appropriate switching function for actuating a drive element. Thus, the actuation of second switching element 21 is essentially used to enable a switching function that is selected by a first switching element 11. Accidentally triggering a switching function by unintentional contact is therefore virtually excluded.

Actuating both a first switching element and the second switching element 11, 21 at the same time could possibly occur merely by resting a palm or an arm on the switching elements. However, in such a case multiple first switching elements 11 are generally actuated at the same time, as the result of which a faulty actuation is recognized, and unintentional triggering of a switching function may be avoided.

FIG. 2 illustrates an embodiment that is optimized in this regard. Its operating principle corresponds to the switching device illustrated in FIG. 1, except that second switching element 22 here is relocated to a lateral housing surface 32 with an approximately right-angle bend, so that the possibility of triggering a switch by resting a hand on the first and second switching elements 11, 22 at the same time is completely ruled out.

In the present case, the thumb of the left hand, not the palm heel, is provided for actuating second switching element 22, while first switching elements 11 continue to be operated with the other fingers of the same hand.

FIG. 3 shows a variant of this embodiment. In this case, two second switching elements 23 are now provided, likewise on a side surface 32 of a housing, with which the window lift functions "window up" and "window down" are associated, as illustrated in the following table:

| Window up |
|---|
| Window down |

The direction of movement of the particular window to be adjusted may be selected by positioning the thumb on one of the two second switching elements 23. This results in the advantage that the number of first switching elements 13 here may be reduced by half compared to the embodiments described above.

The remaining four first switching elements 13 may have, for example, the selection options illustrated below:

| Front driver's side | Front passenger side |
|---|---|
| Rear driver's side | Rear passenger side |

In this case the requirement remains unchanged that in each case a first switching element and a second switching element 13, 23 must be actuated by touch at the same time in order to trigger a switching function.

In another embodiment variant shown in FIG. 4, the function assignment of the first switching elements 13 is the same as in FIG. 3. Second switching elements 24 now form a series of actuating surfaces that allow a window to be moved in several different positions by positioning a thumb. Thus, for example, the window selected by a first switching element 13 may be controlled from the fully open position through four intermediate positions until reaching the fully closed position.

The adjacently situated actuating surfaces also allow the electronics system of the switching device, not illustrated here, to detect a swiping movement over the second switching elements 24 with regard to their direction and speed, in order to subsequently influence the control of a window, selected by means of a first switching element 13, with regard to direction and movement speed.

Of course, in all of the embodiments depicted here, besides the basic functions described it is possible to implement additional functions in the switching device, which may be triggered, for example, by more complex control gestures at the first and second switching elements 11, 13, 21, 22, 23, 24, such as movements of certain switching elements 11, 13, 21, 22, 23, 24 in quick succession. For example, it may be provided that an automatic operation of the window adjustment is initiated by double-tapping a first or second switching element.

It is also advantageous for the switching device to have at least one mechanical actuator, not illustrated here, which in the case of a valid input, or optionally also in the case of an input that is assessed as invalid by the switching device, generates haptic feedback to the user.

It is particularly advantageous to provide quantitatively force-sensitive touch surface sensors as first and/or second switching elements 11, 13, 21, 22, 23, 24, so that the movement speed of a window may be directly influenced by a detected actuating force.

LIST OF REFERENCE NUMERALS 11, 13 first switching elements
21, 22, 23, 24 second switching element(s)
11, 13, 21, 22, 23, 24 switching elements, touch surface sensors
31, 32 housing surfaces (surface, side surface)

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A switching device for actuating drive elements, comprising:
  a plurality of first switching elements situated on a first portion of a first housing surface to be actuatable by fingers of a hand of a person, wherein the first switching elements correspond to respective drive elements;
  a plurality of second switching elements situated either on (i) a second portion of the first housing surface to be actuatable by a palm or a palm heel of the hand of the person or on (ii) a second housing surface to be actuatable by a thumb of the hand of the person while the palm or the palm heel of the hand of the person is on the second portion of the first housing surface, wherein the second switching elements correspond to respective functions for operating the drive elements;
  the first switching elements and the second switching element are formed by touch surface sensors without switching contacts; and
  wherein actuation of one of the first switching elements only when simultaneous with one of the second switching elements being touched at a position causes the drive element corresponding to the one of the first switching elements to be operated according to the function corresponding to the one of the second switching elements.

2. The switching device of claim 1 wherein:
the second switching elements are situated on the second portion of the first housing surface.

3. The switching device of claim 1 wherein:
the second switching elements are situated on the second housing surface; and
the first and second housing surfaces are on different planes.

4. The switching device of claim 1 further comprising:
a mechanical actuator for generating switch haptics.

5. The switching device of claim 1 wherein:
the first switching elements and/or the second switching elements are configured to detect actuating forces.

6. The switching device of claim 1 wherein:
two of the drive elements are first and second windows of a vehicle; and
the function corresponding to a first one of the second switching elements is a close window control function and the function corresponding to a second one of the second switching elements is an open window control function.

7. The switching device of claim 1 wherein:
one of the drive elements is a sliding roof of a vehicle; and
the function corresponding to a first one of the second switching elements is a close roof control function and the function corresponding to a second one of the second switching elements is an open roof control function.

8. The switching device of claim 1 wherein:
actuation of the one of the first switching elements only when being simultaneous with another one of the second switching elements being touched at a position causes the drive element corresponding to the one of the first switching elements to be operated according to the function corresponding to the another one of the second switching elements.

9. The switching device of claim 1 wherein:
actuation of another one of the first switching elements only when being simultaneous with the one of the second switching elements being touched at a position causes the drive element corresponding to the another one of the first switching elements to be operated according to the function corresponding to the one of the second switching elements.

10. The switching device of claim 1 wherein:
the drive element corresponding to the one of the first switching elements is a window of a vehicle and the function corresponding to the one of the second switching elements is either (i) a close window control function, whereby the window is actuated to close during actuation of the one of the first switching elements while the one of the second switching elements is being touched at the position, or (ii) an open window control function, whereby the window is actuated to open during actuation of the one of the first switching elements while the one of the second switching elements is being touched at the position.

11. The switching device of claim 1 wherein:
the drive element corresponding to the one of the first switching elements is a window of a vehicle and the function corresponding to the one of the second switching elements is either (i) a first position control function, whereby the window is actuated to move to a first position during actuation of the one of the first switching elements while the one of the second switching elements is being touched at the position, or (ii) a second position control function, whereby the window is actuated to move to a second position during actuation of the one of the first switching elements while the one of the second switching elements is being touched at the position.

12. The switching device of claim 1 wherein:
the second switching elements include at least three adjacently situated second switching elements; and
actuating direction and/or actuating speed are/is detected when multiple adjacently situated second switching elements are actuated in succession.

* * * * *